United States Patent [19]
Bolyn et al.

[11] Patent Number: 5,757,817
[45] Date of Patent: May 26, 1998

[54] MEMORY CONTROLLER HAVING AUTOMATIC RAM DETECTION

[75] Inventors: Philip C. Bolyn, Norristown; John L. Janssen, West Chester, both of Pa.

[73] Assignee: Unisys Corporation, Blue Bell, Pa.

[21] Appl. No.: 757,253

[22] Filed: Nov. 27, 1996

[51] Int. Cl.⁶ ................................................ G06F 11/00
[52] U.S. Cl. ............................................... 371/21.2
[58] Field of Search ............................... 371/21.2, 21.3, 371/21.1; 365/201, 185.33

[56] References Cited

U.S. PATENT DOCUMENTS 5,539,699  7/1996  Sato et al. ....................... 371/21.2
5,574,857  11/1996  Ramarkrishnan et al. ........... 371/21.2

*Primary Examiner*—Vincent P. Canney
*Attorney, Agent, or Firm*—John B. Sowell; Mark T. Starr

[57] ABSTRACT

A system and method for automatically detecting the presence and configuration (e.g., number of rows and columns) of a writable memory module. A first data pattern is written to a first memory location. One or more data patterns different from the first data pattern are written to a second and subsequent memory locations in a walking-one sequence. After each write to the second and subsequent memory locations the data pattern at the first memory location is read. The read data pattern is compared to the first data pattern to determine if the first data pattern has been overwritten. The first data pattern is overwritten when the number of memory locations has been exceeded.

8 Claims, 4 Drawing Sheets

MEMORY CONTROLLER HAVING AUTOMATIC RAM DETECTION

BACKGROUND OF THE INVENTION

1. Field of the Invention

The present invention relates generally to memory controllers, and more specifically is directed toward the automatic detection of random access memory configurations.

2. Related Art

Writable memory modules are an essential part of every computer system. Examples of a writable memory module include dynamic random access memory (DRAM) and static random access memory (SRAM). Memory configurations vary between computer systems that are geared for operation with different applications or user needs. Different types of writable memory modules can be used to support a memory configuration of a given size. For example, consider the types of DRAMs that are available to system designers. In addition to the different sizes of DRAMs (e.g., 1 Meg, 2 Meg, 4 Meg, . . . ), DRAMs also feature different memory matrices for a given size.

A memory matrix for a DRAM chip is defined by the row and column addresses of the chip. The row and column addresses are parts of the multiplexed address that are provided to the DRAM in separate clock cycles. For example, for a 1 Meg DRAM, 20 address bits are required. In one configuration, the 1 Meg DRAM may have a memory matrix that supports 10 row address bits and 10 column address bits. In another configuration, the 1 Meg DRAM may have a memory matrix that supports 9 row address bits and 11 column address bits. Other configurations are also possible. This situation also exists in other DRAM sizes (e.g., 2 Meg DRAMs having 21 address bits, 4 Meg DRAMs having 22 address bits, 8 Meg DRAMs having 23 address bits, etc.).

Designers of memory controllers are faced with a continuing challenge of adapting existing circuits to interface with writable memory modules of various configurations. For example, in a given year, 1 Meg DRAMs having 9 row bits and 11 column bits may be significantly cheaper than 1 Meg DRAMs having 10 row bits and 10 column bits. Those prices may have reversed a trend that existed up to that year. To take advantage of the price differences, system designers typically redesign a memory controller to interface with the DRAM chips having a different configuration.

This redesigning process can have a significant effect on the lead time and hence the timeliness of the product that is being brought to market. Reduction or elimination of the redesigning process can therefore offer significant cost and time-saving benefits. What is needed is a memory controller that can flexibly adapt to various memory configurations thereby offering increased flexibility to the system designer.

SUMMARY OF THE INVENTION

The present invention satisfies the above mentioned needs by providing a memory controller that is automatically configurable to any writable memory module (i.e., DRAM or SRAM) configuration. This configuration process begins with a detection phase. The detection phase identifies the size of the writable memory module. For SRAMs, the memory controller determines the total number of address bits. For DRAMs, the memory controller determines the number of row and column address bits.

In either case, the memory controller uses a series of writes and reads to determine the number of available address bits for a particular writable memory module. For example, to identify the number of column address bits, the memory controller starts with the writing of a first data pattern into location ADR_0. The first data pattern includes a predefined set of data bits and error correction control (ECC) bits. ADR_0 represents an address with a static row part and all zeros in the column part. Next, the memory controller reads the data pattern at location ADR_0. If the pattern matches the first data pattern, the memory controller knows that a DRAM chip is available.

After the DRAM chip's presence is detected, the memory controller identifies the number of address bits in the column part. This identification process uses a walking-one sequence to define the locations of subsequent writes. In the context of column identification, a walking-one sequence is a series of addresses in which the column part of the address includes a shifting "1". For example, ADR_1 includes a single "1" in the first bit position, ADR_2 includes a single "1" in the second bit position, ADR_3 includes a single "1" in the third bit position, etc. The row part of the address remains static throughout the sequence.

For each of these addresses in the walking-one sequence, the memory controller writes a data pattern that is distinct from the first data pattern written to location ADR_0. After each write, the memory controller reads the data pattern at location ADR_0. The data pattern at location ADR_0 remains unchanged until the single "1" in the column address moves beyond the available address bits in the column part. For example, assume that the DRAM chip has 9 column address bits. When the walking-one sequence reaches ADR_10, the write address has a single "1" in the 10th bit position. This single "1" is not seen by the DRAM chip because the DRAM chip has only 9 column address bits. Accordingly, from the DRAM chip's perspective, ADR_10 is equivalent to ADR_0. This equivalence means that the first data pattern at location ADR_0 is overwritten by a second data pattern different from the first data pattern. The read and comparison process detects this overwriting. When overwriting is detected, the memory controller concludes that the DRAM chip has 9 valid column address bits.

This general process is repeated for the identification of the number of row address bits. In combination, the memory controller identifies the size of the DRAM chip using the sum of the row and column values. Thereafter, the memory controller knows the proper multiplexed parts of the address to use in subsequent memory accesses to that DRAM chip.

In a preferred embodiment, the memory controller uses knowledge of the range of permissible row and column address bits to limit the number of writes and reads. For example if the minimum number of column address bits is 9, the sequence of writes after the write to location ADR_0 will be to determine whether the chip has 9 or more column address bits. No writes are required to determine if the chip has 8 or less column address bits. Knowledge of the permissible ranges of column address bits has precluded the possibility of the chip having 8 or less column address bits.

The foregoing and other features and advantages of the invention will be apparent from the following, more particular description of a preferred embodiment of the invention, as illustrated in the accompanying drawings.

BRIEF DESCRIPTION OF THE FIGURES

In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
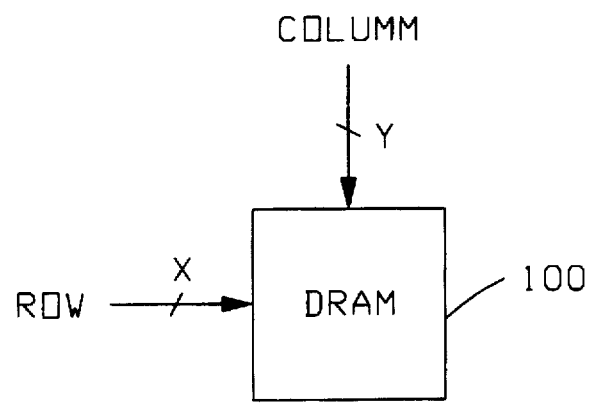
FIG. 1 illustrates an example of the address inputs to a DRAM chip.

The present invention is embodied in a memory controller that controls the reading and writing of data from a plurality of writable memory modules (e.g., DRAMs and SRAMs). FIG. 1 illustrates a high-level overview of the addressing mechanism of a DRAM chip. DRAM chip 100 receives a multiplexed address that comprises a row and a column part. The row and column parts of the multiplexed address are used to access the memory matrix of DRAM chip 100.

Figure 2:
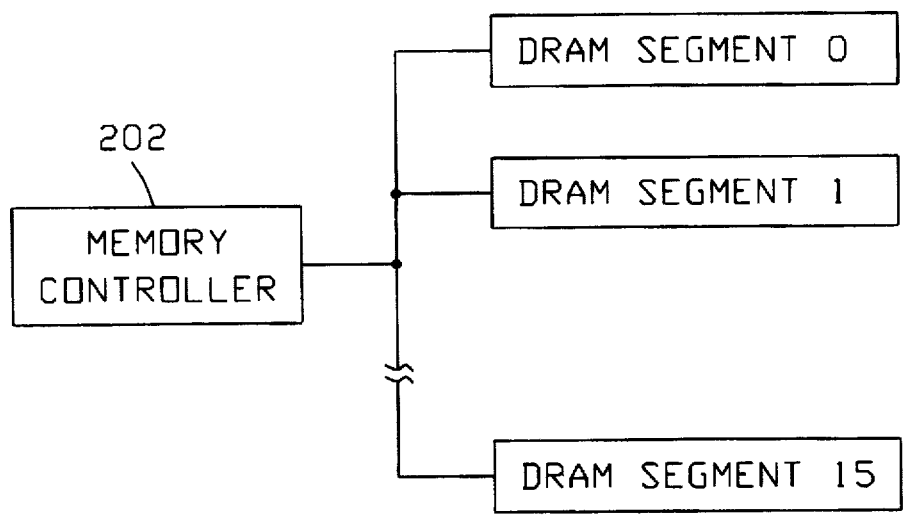
FIG. 2 illustrates a high-level overview of a memory configuration.

FIG. 2 illustrates a high-level overview of a memory configuration. In this exemplary configuration, memory controller 202 interfaces with a plurality of DRAM segments (segments 0 to 15). Each DRAM segment can include, for example, a single in-line memory module (SIMM) or a dual in-line memory module (DIMM) that further includes a plurality of DRAM chips.

At power up, memory controller 202 begins an initialization and detection sequence that checks for the presence of DRAM segments 0–15, the size of DRAM segments 0–15, and the row/column configuration of the DRAM chips within DRAM segments 0–15. The sizes of DRAM segments 0–15 are stored in results registers (not shown) corresponding to DRAM segments 0–15. These results registers allow higher system levels to identify the amount of memory that is available to the system. Row/column configuration data is visible to memory controller 202 and transparent to the higher system levels. As will become apparent from the following description, memory controller 202 can operate with various DRAM segments 0–15 that have varying sizes and row/column configurations.

The general process of detecting the presence, size and row/column configuration of DRAM chips in segments 0–15 is based upon a sequence of writes and reads. For detection, a single write/read sequence can be applied to quickly determine if a DRAM segment is plugged in or generally available. In this simple write/read sequence, a set of data bits and the associated error correction control (ECC) bits are written to a first location in the DRAM chip. The contents of that first location are then read and verified through a comparison with the pattern that was written. Detection of the size and row/column configuration of individual DRAM chips, on the other hand, is based upon a sequence of writes and reads. This process is described in greater detail below.

As noted above, DRAM chips are generally available in 1, 2, 4, 8, 16, 32 and 64 Meg sizes. These DRAM chip sizes require 20, 21, 22, 23, 24, 25 and 26 address bits respectively. Row and column configurations for these sizes are determined by the manufacturer. As noted above, a 1 Meg DRAM chip may have a 10/10 or 9/11 row/column configuration. At power up, memory controller 202 identifies the specific number of row address bits and column address bits for a given DRAM chip. This process is described with reference to Tables 1 and 2 and the flow chart of FIG. 3.

Table 1 illustrates an example of a sequence of addresses that can be used in a sequence of writes and reads to and from a DRAM chip. This sequence of addresses is used to determine the column configuration for the DRAM chip. As shown, the column part of the sequence of addresses represents a "walking-one" sequence. The row part of the address is kept as a constant. In the simplest case, it is maintained as all zeros.

In the walking-one sequence, a "1" is shifted through the possible bit positions (i.e., 1 ... X). Specifically, ADR_0 is all zeros, ADR_1 has a "1" in the first bit position, ADR_2 has a "1" in the second bit position, ... , ADR_N has a "1" in the nth bit position, etc. Note that X can represent the known maximum possible number of row or column address bits that are available in currently manufactured chips.

TABLE 1

| ADR | ROW | COL |
|---|---|---|
| 0 | 0...0 | 0...0 |
| 1 | 0...0 | 0...1 |
| 2 | 0...0 | 0...10 |
| 3 | 0...0 | 0...100 |
| . | . | . |
| . | . | . |
| . | . | . |
| N | 0...0 | 0...010...0 |
| . | . | . |
| . | . | . |
| . | . | . |
| X | 0...0 | 1...0 |

Generally, the "walking-one" sequence identifies the number of columns in the DRAM chip by finding an address (i.e., ADR_N) that is equivalent to ADR_0 from the DRAM chip's perspective. For example, if the DRAM chip has nine column address bits, then each of the addresses (ADR_0 to ADR_9) are distinct addresses from the DRAM chip's perspective. ADR_10, however, is equivalent to ADR 0. This results since a "1" in the 10th bit position of the column part of the address is not seen by the DRAM chip. The DRAM chip's nine valid column address lines receive only the first nine zeros.

Figure 3:
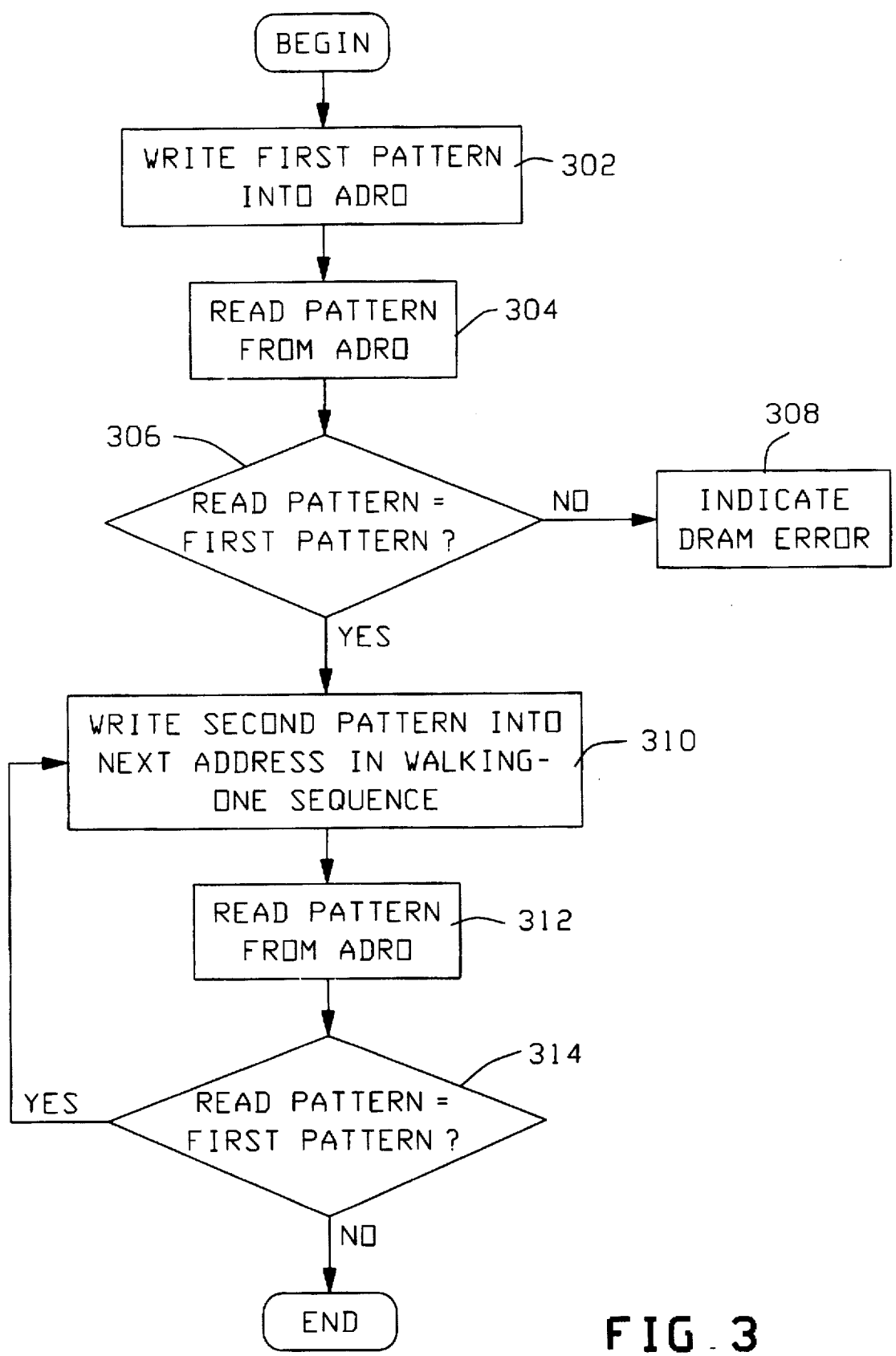
FIG. 3 illustrates a flow chart of the row/column detection process.

FIG. 3 illustrates a flow chart of the general process used to identify the point at which the addresses are equivalent from the DRAM chip's perspective. The identification process begins at step 302, where memory controller 202 writes a first data pattern (i.e., data bits plus ECC bits) into the ADR_0 location. In the example illustrated in Table 1, ADR_0 has a "0" in each of the row and column bit positions. Note that the row bit positions are maintained as all "0"s in the example of Table 1.

Next, in step 304, memory controller 202 reads the data pattern that is stored in the ADR_0 location. This read pattern is compared to the first data pattern at step 306. In this comparison step, memory controller 202 does a strict bit-by-bit comparison of both the data bits and the ECC bits after single bit error correction. If the read pattern is not equal to the first pattern, then at step 308, memory controller 202 indicates that the DRAM chip has an error. Further testing can determine whether the ADR_0 location is part of a defective block in the DRAM chip or whether the DRAM chip is unavailable (e.g., does not exist).

If the read data pattern is equivalent to the first data pattern, the identification process continues at step 310 where memory controller 202 writes a second data pattern distinct from the first data pattern into the next address location in the walking-one sequence. Specifically, a second data pattern is written to location ADR__1. Next, at step 312, the data pattern at location ADR__0 is read. At step 314, the read pattern is compared to the first data pattern that was written into location ADR__0 at step 302. This comparison step is also a strict bit-by-bit comparison of the data bits and the ECC bits after single bit error correction.

If the read pattern is equal to the first pattern, then memory controller 202 knows that the first data pattern has not been overwritten. Thus, ADR__0 and ADR__1 are distinct addresses from the DRAM chip's perspective. Memory controller 202 then loops back to step 310 where the second data pattern or a third data pattern is written to the next address in the walking-one sequence (i.e., ADR__2). The primary criteria for the second or third data pattern is that they be distinct from the first data pattern written to location ADR__0. This writing, reading and comparison process of steps 310, 312 and 314 continues until the read pattern from location ADR__0 is not equal to the first data pattern. At that point, memory controller 202 knows that ADR__0 and ADR__N are identical from the DRAM chip's perspective. Memory controller 202 therefore concludes that the DRAM chip has N-1 columns. The column configuration testing process then ends.

In the sequence of writes and reads described above, comparisons between the data patterns at locations ADR__1 and ADR__0 provide little information in terms of determining the DRAM chip's column configuration. This results since the two address values are distinct in the same column address bit. Note that this comparison can provide useful information with respect to DRAM error detection. In a similar manner, a comparison between the data patterns at locations ADR__2 and ADR__0 provide little information since all DRAM chips have more than one column address bit. For purposes of discussion, it is assumed that currently available DRAM chips have column address bits that range between 9 and 13. Accordingly, steps 310, 312 and 314 are only meaningful when they seek to determine if the DRAM chip has nine or more column address bits.

In a preferred embodiment, the sequence of writes and reads does not step through the entire list of addresses in the walking-one sequence of Table 1. Rather, the series of writes and reads is limited based upon prior knowledge of possible DRAM row/column configurations. If it is assumed that the minimum number of column address bits in currently manufactured DRAM chips is nine, the first meaningful comparison from a column sizing perspective is whether a data pattern written to location ADR__10 has overwritten the first data pattern at ADR__0. If overwriting has occurred, memory controller 202 can conclude that the DRAM chip has nine address bits. Note that writing and reading from ADR__9 can provide useful information for error detection and verification processes.

Thus, with reference to the flow chart of FIG. 3, the first instance of step 310 would cause the writing of a data pattern to location ADR__9. Thereafter, each successive loop would follow the walking-one sequence of Table 1. Note also that prior knowledge of a maximum number of column address bits in currently available DRAM chips could allow memory controller 202 to determine the number of columns without actually overwriting the first data pattern at location ADR__0. Specifically, if DRAM chips have a maximum of 13 column address bits, then the last loop through steps 310, 312 and 314 would include the writing of data into location ADR__13. If the first data pattern at location ADR__0 is overwritten memory controller 202 concludes that the DRAM chip has 12 column address bits. If the first data pattern at location ADR__0 is not overwritten then memory controller 202 can conclude that the DRAM chip has more than 12 column address bits. This condition can only be satisfied by a DRAM chip having the maximum number of column address bits (i.e., 13 bits).

After the number of column address bits in the DRAM chip are identified, memory controller 202 proceeds to identify the number of row address bits. This row identification process proceeds in a similar manner to the column identification process outlined above. As illustrated in Table 2, the row identification process uses a "walking-one" sequence for the row bits and a static value for the column bits (e.g., all zeros).

TABLE 2

| ADR | ROW | COL |
|-----|-----|-----|
| 0 | 0 ... 0 | 0 ... 0 |
| 1 | 0 ... 1 | 0 ... 0 |
| 2 | 0 ... 10 | 0 ... 0 |
| 3 | 0 ... 100 | 0 ... 0 |
| . | . | . |
| . | . | . |
| . | . | . |
| N | 0 ... 010 ... 0 | 0 ... 0 |
| . | . | . |
| . | . | . |
| . | . | . |
| X | 1 ... 0 | 0 ... 0 |

Figure 4:
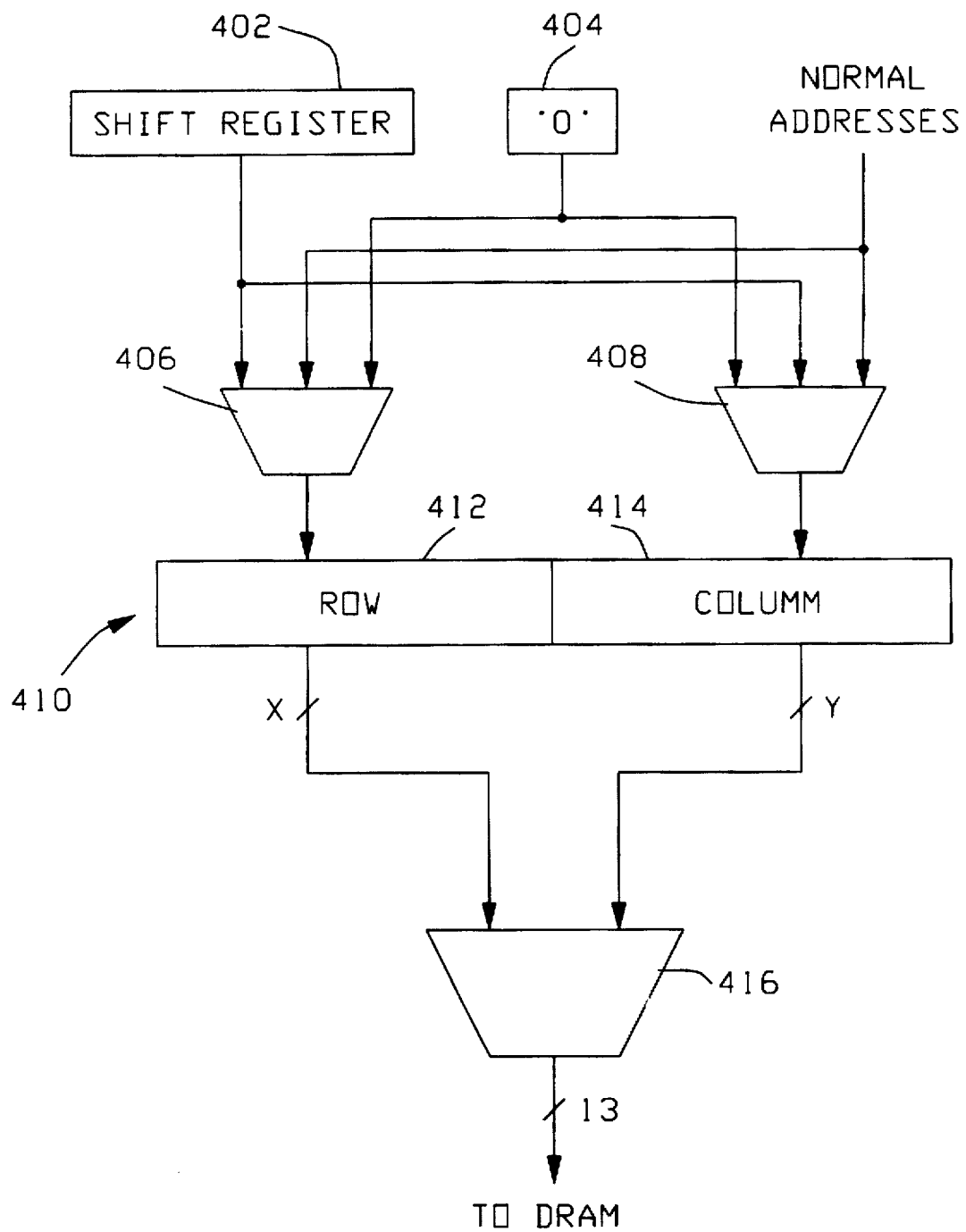
FIG. 4 illustrates an address generation mechanism.

FIG. 4 illustrates an address generation mechanism according to the present invention. Three inputs are used to provide address bits to address register 410. The first input is shift register 402. Shift register 402 generates the "walking-one" sequence that is used in the write/read sequence of both the row and column identification processes.

In a preferred embodiment, the size of shift register 402 is limited based upon the range of possible row and column sizes. For example, if the minimum and maximum row and column sizes is 9 and 13 respectively, then shift register 402 need only provide a 4-bit sequence for bit positions 10–13. These bits are used to generate addresses ADR__10 to ADR__13. Since ADR__9 is also written to for error detection and verification processes, the shift register is expanded to provide a 5-bit sequence. The rest of the address bits (i.e., bits 1–8) can be filled with zeros from "0" generator 404. The 5-bit sequence can be generated by a 5-bit shift register.

Alternatively, the 5-bit sequence can be generated by a 6-bit shift register having 5 visible bits. In this embodiment, the 6-bit shift register starts with a "1" in the non-visible bit (NVB) position. In the example illustrated in Table 3, the non-visible bit is located at the first bit position. From this starting position, shift register 402 can provide the zeros in the five visible bit positions as bits 9–13 for location ADR__0.

TABLE 3

| Location | Visible Bits (Shift Reg) | NVB | Address |
|----------|--------------------------|-----|---------|
| ADR__0 | 00000 | 1 | 0000000000000 |
| ADR__9 | 00001 | 0 | 0000100000000 |
| ADR__10 | 00010 | 0 | 0001000000000 |
| ADR__11 | 00100 | 0 | 0010000000000 |
| ADR__12 | 01000 | 0 | 0100000000000 |
| ADR__13 | 10000 | 0 | 1000000000000 |

The next location in the sequence is ADR__9. For this location, the six-bit shift register shifts the "1" into the second bit position. The second bit position is the first visible bit position. The five visible bits are provided as bit positions 9–13 of the address for location ADR_9. As illustrated in Table 3, ADR_9 has a "1" in the 9th bit position. As further illustrated by Table 3, the shifting of the "1" in the visible positions of the 6-bit shift register corresponds to the shifting of the "1" in bit positions 9–13 of the final address value.

As noted above, a second input is provided by "0" generator 404. "0" generator 404 provides the "0" inputs that are used to fill (1) the part of the "walking-one" sequence not filled by shift register 402, and (2) the address bits of the row or column that are not being tested (i.e., row bits of Table 1 and column bits of Table 2). Note that the row bits of Table 1 and column bits of Table 2 need not be filled with zeros. The sole criteria is that they be constant throughout the testing process. Finally, the third input to address register 410 is the normal addressing path of memory controller 202. The normal addressing path is used by memory controller 202 to effect the normal reading and writing from the DRAM chip. In this manner a single address register is used in the detection and operational phases.

As illustrated in FIG. 4, the proper address inputs are forwarded to address register 410 via multiplexers 406 and 408. Multiplexer 406 directs proper address inputs to a row part 412 of address register 410. Multiplexer 408, on the other hand, directs proper address inputs to a column part 414 of address register 410. The row and column address bits in address register 410 are sent to a DRAM chip in multiple cycles. In a first cycle, multiplexer 416 selects the X row address bits to send to the DRAM chip. In a second cycle, multiplexer 416 selects the Y column address bits to send to the DRAM chip.

Figure 5:
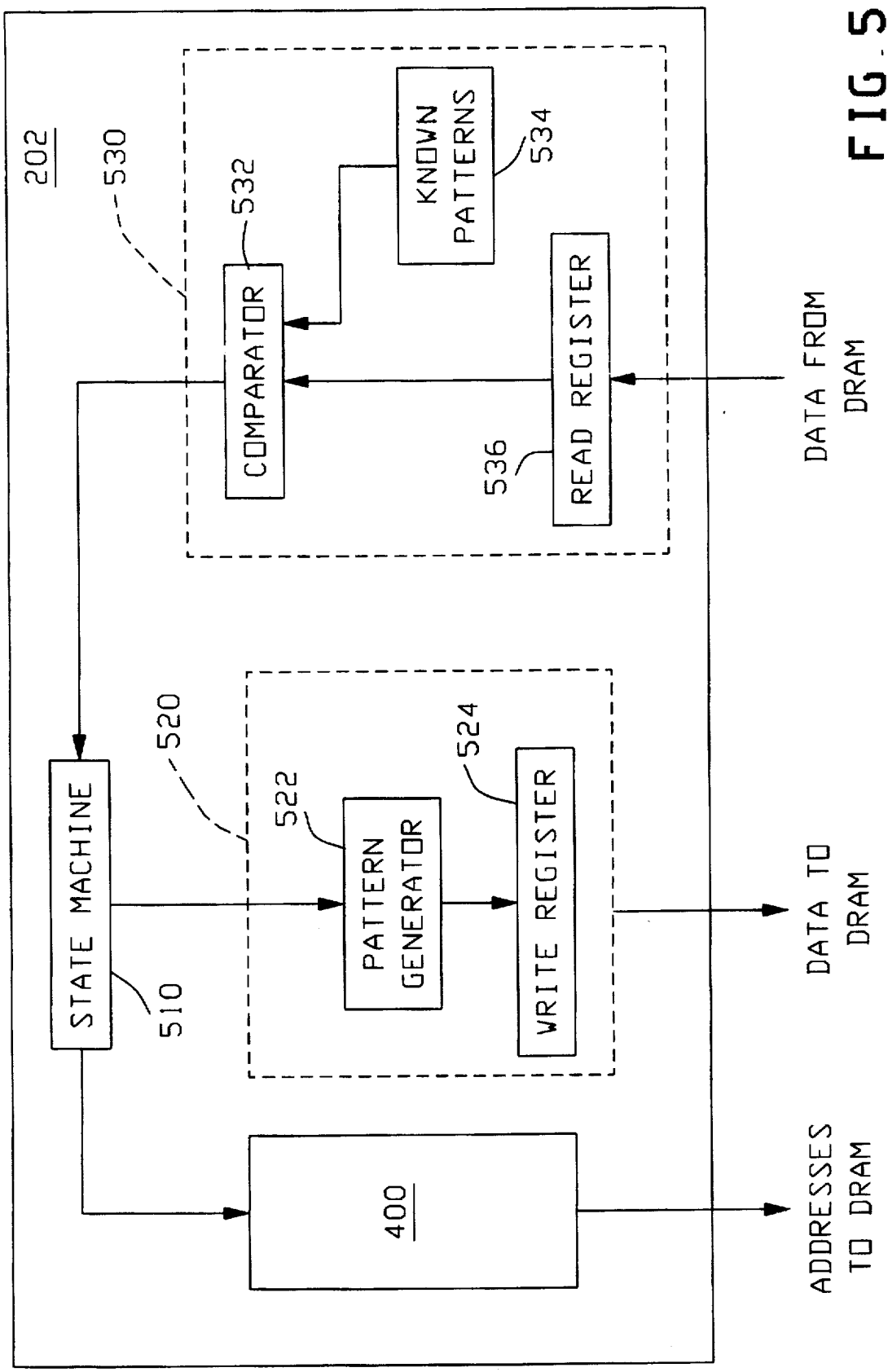
FIG. 5 illustrates a read/write interface of a memory controller according to the present invention.

FIG. 5 illustrates a preferred embodiment of a part of memory controller 202 that controls the write/read sequence of the column and row identification process. Memory controller 202 includes address generation mechanism 400, write mechanism 520 and read mechanism 530. Memory controller 202 also includes hardware state machine 510. Hardware state machine 510 controls address generation mechanism 400, write mechanism 520 and read mechanism 530. As would be apparent to one of ordinary skill in the relevant art, the control features of state machine 510 could also be implemented as microcode within memory controller 202.

Hardware state machine 510 controls the operation of shift register 402 as well as multiplexers 406, 408 and 416. During the DRAM identification process, state machine 510 directs multiplexers 406 and 408 to select outputs of shift register 402 and "0" register 404. During the normal operation of memory controller 202, state machine 510 directs multiplexers 406 and 408 to select from the normal address path.

As noted above, shift register 402 shifts a "1" to produce a walking-one sequence. In the preferred embodiment, shift register 402 shifts a "1" sequentially from a non-visible bit position to the five remaining visible bit positions. The output of shift register 402 in combination with "0" register 404 produces the following sequence of address locations: ADR_0, ADR_9, ADR_10, ADR_11, ADR_12 and ADR_13. These addresses are stored in either row 412 or column 414 parts of address register 410. Finally, state machine 510 directs multiplexer 416 to choose either row 412 or column 414 parts of address register 410 to output to the DRAM chip.

State machine 510 also controls pattern generator 522 of write mechanism 520. Pattern generator stores at least two data patterns. As noted above, these two data patterns include both the data bits and the ECC bits. When memory controller writes to location ADR_0, state machine 510 directs pattern generator 522 to output the first data pattern to write register 524. The first data pattern stored in write register 524 is written to the DRAM location defined by address generation mechanism 400. This process corresponds to step 302 of FIG. 3.

Next, read register 536 receives a read data pattern from location ADR_0. Address ADR_0 is provided by address generation mechanism 400. This read data pattern is sent to comparator 532. Comparator 532 also receives a copy of the first data pattern from storage 534. The result of the comparison is sent to state machine 5110. This process corresponds to steps 304 and 306 of FIG. 3. If the result provided by comparator 532 indicates that the DRAM chip is operational, state machine 510 instructs shift register 402 to shift the "1" to the first visible bit position (i.e., ADR_9). State machine also directs pattern generator 522 to output a second data pattern to write register 524. After this second data pattern is written to location ADR_9, the same reading and comparison process follows. State machine 510 continues this loop until comparator 532 indicates that the first data pattern at location ADR_0 has been overwritten.

In an alternative embodiment, the "walking-one" sequence can be replaced with a sequence represented by Table 4.

TABLE 4

| ADR | ROW |
|-----|------|
| 0 | 0 . . . 0 |
| 1 | 0 . . . 1 |
| 2 | 0 . . . 1A |
| 3 | 0 . . . 1BC |
| 4 | 0 . . . 1DEF |
| 5 | 0 . . . 1GHIJ |
| . | . |
| . | . |
| . | . |

This sequence is similar to the "walking-one" sequence in that a walking "1" is present on the "leading edge" of the sequence. The following digits in the sequence, however, need not be all zeros. Instead the sequences "A", "BC", "DEF", "GHIJ", etc. can be a mix of ones and zeros. Thus, if a DRAM has only 4 row bits, a data pattern that is intended to be written to ADR_5 (i.e., "1GIHJ") is written instead to address "GHIJ". By reading the contents of location "GHIJ" and comparing the contents to the data pattern, the system can then determine whether the DRAM has only 4 row bits.

Having described the general operation of a DRAM detection process, it should be noted that the same general inventive concepts are also applicable to a SRAM detection process. Conventional SRAMs do not use multiplexed addressing (i.e., row and column addresses). Instead, a 1 Meg SRAM is provided with 20 bits in one cycle. To detect the SRAM size, memory controller 202 simply operates as though either row part 412 or column part 414 did not exist. The remaining analysis identifies whether a SRAM chip has between 20 and 26 address bits.

While the invention has been particularly shown and described with reference to preferred embodiments thereof, it will be understood by those skilled in the relevant art that various changes in form and details may be made therein without departing from the spirit and scope of the invention.

What is claimed is:

1. A system for automatically detecting the number of rows and columns of a writable memory module, the system comprising:

means for writing to a first memory location a first data pattern;

means for writing to second and subsequent memory locations one or more data patterns different from said first data pattern, wherein said one or more data patterns is written to said first memory location when the number of memory locations has been exceeded;

means for reading the data pattern stored at said first memory location following the writing of a data pattern to each of said second and subsequent memory locations in sequence; and means for comparing the data pattern stored in said first memory location to said first data pattern.

2. The system of claim 1, wherein said second and subsequent memory locations define a walking-one sequence.

3. A method for automatically detecting the number of rows and columns of a writable memory module, the method comprising the steps of:

(1) writing to a first memory location a first data pattern;

(2) writing to second and subsequent memory locations one or more data patterns different from said first data pattern, wherein said one or more data patterns is written to said first memory location when the number of memory locations has been exceeded;

(3) reading the data pattern stored at said first memory location following the writing of a data pattern to each of said second and subsequent memory locations in sequence; and (4) comparing the data pattern stored in said first memory location to said first data pattern.

4. The method of claim 3, wherein said step (2) comprises the step of writing to second and subsequent memory locations in a walking-one sequence one or more data patterns different from said first data pattern.

5. A system for automatically detecting the configuration of a writable memory module, the system comprising:

means for writing to a sequence of memory locations one or more data patterns, wherein each address in said sequence of memory locations includes a one at a leading edge position;

means for reading a data pattern stored at a memory location, said memory location defined by a bit sequence following the one at the leading edge position of a particular address; and means for comparing the data pattern stored in said memory location to one of said data patterns.

6. The system of claim 5, wherein said memory module contains addressable rows and columns, and said system operates once to determine the number of valid addressable row bits and once to determine the number of valid addressable column bits.

7. A method for automatically detecting the configuration of a writable memory module, comprising the steps of:

(1) writing to a sequence of memory locations one or more data patterns, wherein each address in said sequence of memory locations includes a one at a leading edge position;

(2) reading a data pattern stored at a memory location, said memory location defined by a bit sequence following the one at the leading edge position of a particular address; and (3) comparing the data pattern stored in said memory location to one of said data patterns.

8. The system of claim 5, wherein said memory module contains addressable rows and columns, said method being performed once to determine the number of valid addressable row bits and once to determine the number of valid addressable column bits.

* * * * *